(12) United States Patent
Yamamoto et al.

(10) Patent No.: US 8,770,111 B2
(45) Date of Patent: Jul. 8, 2014

(54) TRANSPORT VEHICLE AND TRANSPORT SYSTEM

(75) Inventors: Taro Yamamoto, Ise (JP); Yusuke Fujiwara, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 13/877,278

(22) PCT Filed: Sep. 8, 2011

(86) PCT No.: PCT/JP2011/070423
§ 371 (c)(1),
(2), (4) Date: Apr. 30, 2013

(87) PCT Pub. No.: WO2012/046535
PCT Pub. Date: Apr. 12, 2012

(65) Prior Publication Data
US 2013/0213257 A1    Aug. 22, 2013

(30) Foreign Application Priority Data

Oct. 4, 2010    (JP) .................................. 2010-224740

(51) Int. Cl.
*B61B 3/00*    (2006.01)
(52) U.S. Cl.
USPC .............................. 104/89; 105/150; 414/282
(58) Field of Classification Search
CPC ... H01L 21/67; H01L 21/677; H01L 21/6773; H01L 21/67733; H01L 21/67736; H01L 21/67715
USPC ...................................... 104/89–95
See application file for complete search history.

(56) References Cited

U.S. PATENT DOCUMENTS 7,437,999 B2 * 10/2008 Nakao ............................ 104/106
7,461,598 B2 * 12/2008 Shiwaku ..................... 104/88.01

(Continued)

FOREIGN PATENT DOCUMENTS

JP    53087469 A    8/1978
JP    2005187175 A    7/2005

(Continued)

OTHER PUBLICATIONS

Japanese language international search report dated Nov. 1, 2011 and its English language translation issued in corresponding PCT application PCT/JP2011/070423 cites the U.S. patent application publication and foreign patent documents listed above.

(Continued)

*Primary Examiner* — Jason C Smith
(74) *Attorney, Agent, or Firm* — DLA Piper LLP (US)

(57) ABSTRACT

A transport vehicle that reduces shaking of a transport article includes a travelling unit, a transport unit, a fall prevention member, and a shaking reduction member. The travelling unit travels along a rail provided on a ceiling. The transport unit transports a transport article. The fall prevention member is rotatably supported such that it can rotate between a fall prevention position and a retracted position. The fall prevention member is, at the fall prevention position, below the transport article. A pushing portion of the shaking reduction member pushes against a side surface of the transport article with a pushing surface thereof in conjunction with the rotating of the fall prevention member from the retracted position to the fall prevention position. A lever portion of the shaking reduction member has one end supporting the pushing portion and the other end rotatably supported in a manner coaxial with the fall prevention member.

7 Claims, 10 Drawing Sheets

(56) References Cited

U.S. PATENT DOCUMENTS

| | | | |
|---|---|---|---|
| 7,578,240 B2 * | 8/2009 | Shiwaku | 104/89 |
| 7,735,424 B2 * | 6/2010 | Nakashima et al. | 104/89 |
| 7,753,639 B2 * | 7/2010 | Hoshino | 414/282 |
| 7,972,104 B2 * | 7/2011 | Shiwaku et al. | 414/282 |
| 8,550,006 B2 * | 10/2013 | Wada | 104/89 |
| 8,591,163 B2 * | 11/2013 | Toyoda et al. | 414/411 |
| 2004/0126208 A1 * | 7/2004 | Tawyer et al. | 414/222.02 |
| 2004/0253087 A1 * | 12/2004 | Iizuka | 414/626 |
| 2006/0072987 A1 * | 4/2006 | Hoshino | 414/277 |
| 2006/0222479 A1 * | 10/2006 | Shiwaku et al. | 414/267 |
| 2006/0230975 A1 * | 10/2006 | Shiwaku | 104/88.01 |
| 2007/0041815 A1 | 2/2007 | Wirz et al. | |
| 2007/0163461 A1 * | 7/2007 | Shiwaku | 104/89 |
| 2010/0239400 A1 * | 9/2010 | Ishikawa | 414/373 |
| 2011/0188977 A1 * | 8/2011 | Toyoda et al. | 414/411 |
| 2013/0177857 A1 * | 7/2013 | Shibazaki | 430/325 |
| 2013/0213257 A1 * | 8/2013 | Yamamoto et al. | 105/150 |
| 2014/0047995 A1 * | 2/2014 | Kobayashi | 104/89 |

FOREIGN PATENT DOCUMENTS

| | | |
|---|---|---|
| JP | 2006522724 A | 10/2006 |
| JP | 2006298535 A | 11/2006 |

OTHER PUBLICATIONS

English language translation of international preliminary report on patentability dated May 16, 2013 issued in corresponding PCT application PCT/JP2011070423.

* cited by examiner

TRANSPORT VEHICLE AND TRANSPORT SYSTEM

CROSS REFERENCE TO RELATED APPLICATIONS

This application is a national stage of international application PCT/JP2011/070423, filed on Sep. 8, 2011, and claims the benefit of priority under 35 USC 119 of Japanese application 2010-224740, filed on Oct. 4, 2010, which are incorporated herein by reference.

TECHNICAL FIELD

The present invention relates to a technical field of a transport vehicle for transporting a transport article such as a container storing various substrates for manufacturing semiconductor devices, along a rail, and of a transport system including the transport vehicle.

BACKGROUND ART

As this kind of the transport vehicle, a hanging type one (what is called OHT: Overhead Hoist Transport) travelling, for example, along a rail provided on a ceiling to transport a transport article such as a FOUP (Front Opening Unified Pod) has been known. Some of these transport vehicles include a fall prevention member and a shaking reduction member (refer to Patent Document 1, for example). The fall prevention member projects under the loaded transport article to prevent the transport article from falling. The shaking reduction member can rotate in conjunction with the fall prevention member to push against the transport article to reduce the shaking. The shaking reduction member includes rollers with which an offset, which is caused by a difference between a position at which the shaking reduction member starts to abut against the transport article and a position at which the fall prevention member has completed its projection, can be adjusted (refer to Patent Document 2, for example).

[Patent Document 1] Unexamined Patent Publication 2005-187175

[Patent Document 2] Unexamined Patent Publication 2006-298535

DISCLOSURE OF INVENTION

Technical Problem

However, as described above, since the shaking reduction member including the rollers can rotate, it is difficult to obtain sufficient reduction of the shaking in a direction intersecting the pushing direction. If a centrifugal force is applied when the transport vehicle travels along a curve, the rollers rotate according to the lateral shaking of the transport article, thereby causing the transport article to shake relatively largely.

Recently, the weight of the transport article has been dramatically increased due to the increase of the diameter of semiconductor substrates, for example. Since the centrifugal force exercised on the transport vehicle increases as the weight of the transport article increases, the above-described effect on the transport article by the centrifugal force is significant. In other words, the shaking reduction member including the rollers has a technical problem that the shaking reduction member cannot effectively reduce the shaking of the large-size transport articles.

The present invention was conceived in view of the above-described problem, for example. It is an object of the present invention to provide a transport vehicle and a transport system that can effectively reduce the shaking of the transport article.

Technical Solution

A transport vehicle according to the present invention comprises a travelling unit, a transport unit, a fall prevention member, and a shaking reduction member. The travelling unit is configured to travel along a rail provided on a ceiling. The transport unit is attached to the travelling unit, and is configured to transport a transport article while having the transport article stored in a storage space thereof. The fall prevention member is provided around a lower end of the transport unit, and is rotatably supported so as to rotate between a retracted position in which the fall prevention member allows the transport article to be accommodated into the storage space and a fall prevention position in which the fall prevention member prevents the transport article from falling from the storage space. The fall prevention member is disposed under the transport article when the fall prevention member is positioned at the fall prevention position. The shaking reduction member includes a pushing portion and a lever portion. The shaking reduction member is provided higher than the fall prevention member. The pushing portion pushes against a side surface of the transport article with a pushing surface thereof in conjunction with the rotating of the fall prevention member from the retracted position to the fall prevention position. The lever portion has one end supporting the pushing portion and the other end rotatably supported in a manner coaxial with the fall prevention member.

According to the transport vehicle of the present invention, while the travelling unit travels along the rail provided on the ceiling, the transfer unit attached to the travelling unit transports the transport article which is loaded on the transport unit. The transport unit is typically hanged from the travelling unit. The transport unit includes a holding unit for holding the transport article, and the transport article held by the holding unit is accommodated into the storage space of the transport unit when the transport article is loaded. The storage space is defined as an inside space of the transport unit opened downward, for example.

According to the transport vehicle of the present invention, the fall prevention member is provided around the lower end of the transport unit. The fall prevention member is rotatably supported between the fall prevention position and the retracted position. It should be noted that "the lower end" means a position low enough to support the transport article loaded in the storage space can be supported from below. The fall prevention member supports the held transport article from below if the transport article happens to fall due to the shaking of the transport vehicle, for example. As a result, the transport article is prevented from falling.

The fall prevention member is rotatably supported such that it can be between the retracted position in which the transport article can be stored into the storage space and the fall prevention position in which the transport article is prevented from falling from the storage space. More specifically, when the transport article is to be transferred, at least a part of the fall prevention member is retracted so as to form a space, through which the transport article can pass, at and near an inlet of the storage space. In contrast, when the transport article has been transferred, the fall prevention member projects so as to close a part of the inlet of the storage space from below, thereby preventing the transport article from falling from the storage space.

According to the transport vehicle of the present invention, the shaking reduction member is provided higher than the fall prevention member in the transport unit. Especially, the shaking reduction member is rotatably supported coaxially with the fall prevention member. It should be noted that "coaxially" here is a broad concept that includes a case in which the fall prevention member and the shaking reduction member are supported by the same shaft, for example, and a case in which axial centers of the fall prevention member and the shaking reduction member are close to each other to an extent that the later-described effect of the invention is exerted.

The shaking reduction member pushes against the side surface of the loaded transport article in order to reduce the shaking. It should be noted that "shaking" here means a displacement amount generated when the transport article transferred by the transport vehicle is shaken due to the centrifugal force occurred when travelling along a curve. The shaking reduction member includes a pushing portion and a lever portion. The pushing portion has a pushing surface for pushing against the side surface of the transport article. The lever portion has one end supporting the pushing portion and the other end supported coaxially with the fall prevention member. For example, the pushing portion may be composed by an elastic body or the like. If the transport article is pushed against by the pushing portion, it is possible to reduce the vibration transmitted to the transport article. It should be noted that "vibration" here means the acceleration of the above-described shaking.

The shaking reduction member is configured to project so as to push against the side surface of the transport article in conjunction with the rotating of the fall prevention member from the retracted position to the fall prevention position. More specifically, when the fall prevention member is positioned at the retracted position, the shaking reduction member is accommodated into a position where it does not get into contact with the loaded transport article. Accordingly, when the fall prevention member is moved from the retracted position to the fall prevention position, the lever portion rotates in conjunction with the movement of the fall prevention member, so that the pushing surface of the pushing portion is pushed against the side surface of the loaded transport article.

According to the present invention, the fall prevention member and the shaking reducing member provided at the transport unit are supported coaxially. Therefore, it is possible to avoid a situation in which the position of the pushing portion of the shaking reduction member when the pushing portion starts to get into contact with the transport article and the position of the pushing portion of the shaking reduction member when the fall prevention member is positioned under the transport article are different from each other. Accordingly, the pushing portion of the shaking reduction member can be configured as a member that can laterally push against the transport article with a pushing surface thereof, instead of a member such as the above-described rollers with which the offset can be adjusted. Since the transport article is pushed against in a plane-to-plane manner, it is possible to address the shaking in a direction intersecting the pushing direction.

As described above, according to the transport vehicle of the present invention, since the fall prevention member and the shaking reducing member are provided coaxially, it is possible to advantageously prevent the transport article from falling and to advantageously reduce the shaking of the transport article.

According to one aspect of the transport vehicle of the present invention, the pushing portion gets into contact with the transport article in a way that the axial line of the lever portion in a longitudinal direction is inclined relative to the side surface of the transport article. In other words, when the shaking reduction member pushes against the transport article, the pushing surface of the pushing portion pushes against the side surface of the transport article while the axial line in the longitudinal direction of the lever portion is oblique relative to the side surface of the transport article. Accordingly, even if the transport article is shaken in the pushing direction of the shaking reducing member (in other words, the travelling direction of the transport vehicle) due to acceleration or deceleration of the transport vehicle, the shaking reduction member follows the transport article, and thereby effectively reduces the shaking.

According to one aspect of a transport vehicle of the present invention, the shaking reduction member includes a projection control member. The projection control member is configured to prevent the shaking reduction member from projecting toward the transport article by pushing against the shaking reduction member when the fall prevention member is positioned at the retracted position. The projection control member allows the shaking reduction member to project toward the transport article by releasing the pushing against the shaking reduction member when the fall prevention member is positioned at the fall prevention position.

According to this aspect, when the fall prevention member is positioned at the retracted position, it is possible to prevent the shaking reduction member from erroneously projecting. Accordingly, it is possible to surely link the fall prevention member and the shaking reduction member to each other. If the fall prevention member and the shaking reduction member are linked to each other, it is possible to control movements of both the fall prevention member and the shaking reducing member with one actuator for example. As a result, high complexity of the device configuration and the increase in the manufacture cost can be prevented.

According to another aspect of the transport vehicle of the present invention, the shaking reduction member includes an urging member urging the one end of the lever portion toward the side surface of the transport article.

According to this aspect, the shaking reduction member pushes against the transport article by means of the urging member, such as a torsion spring. The use of the urging member makes it possible to push against the transport article with flexibility to some degree, instead of rigidly fixing the transport article. Accordingly, it is possible to prevent the vibration of the loaded transport article from increasing.

According to another aspect of the transport vehicle of the present invention, the pushing portion is rotatably supported by the lever portion.

According to this aspect, since the pushing portion is rotatably supported, it is possible to adjust the angle of the pushing surface pushed against by the transport article depending on the position or angle of the side surface of the transport article. For example, the outer dimension of the transport article may have variation due to manufacture errors and assembly errors. Despite this case happens, the pushing portion according to the present invention can surely push against the side surface of the transport article. As a result, it is possible to more surely reduce the shaking of the transport article.

According to another aspect of the transport vehicle of the present invention, the lever portion includes a rotating restriction member configured to restrict the rotating of the pushing portion at or below a predetermined amount.

According to this aspect, since the rotating restriction member restricts the rotating of the pushing portion, it is possible to prevent the pushing portion from rotating freely. Accordingly, since the pushing portion does not rotate too much, it is possible to avoid a situation in which the pushing surface cannot get into contact with the side surface of the transport article. Accordingly, the pushing portion can surely push against the side surface of the transport article in a plane-to-plane manner. As a result, it is possible to more surely reduce the shaking of the transport article.

A transport system according to the present invention comprises a transport vehicle according to the present invention (including various aspects of the present invention) in order to solve the above-described problem.

According to the transport system of the present invention, since the above-described transport vehicle of the present invention is provided, it is possible to advantageously prevent the transport article from falling and to advantageously reduce the shaking of the transport article. It should be noted that the effect of the present invention will be more apparent and more advantageous when the present invention is utilized in a system including a lot of factors that may result in lateral shaking or rolling of the transport vehicle, such as a rail having a lot of curves.

Advantageous Effects

According to the present invention, it is possible to provide a transport vehicle and a transport system in which the shaking of the transport article can be effectively reduced. It should be noted that effects and other advantages of the present invention will be apparent from the embodiments of the present invention to be later explained.

EMBODIMENTS FOR CARRYING OUT THE INVENTION

Hereinafter, an embodiment of the present invention will be explained with reference to the drawings.

Figure 1:
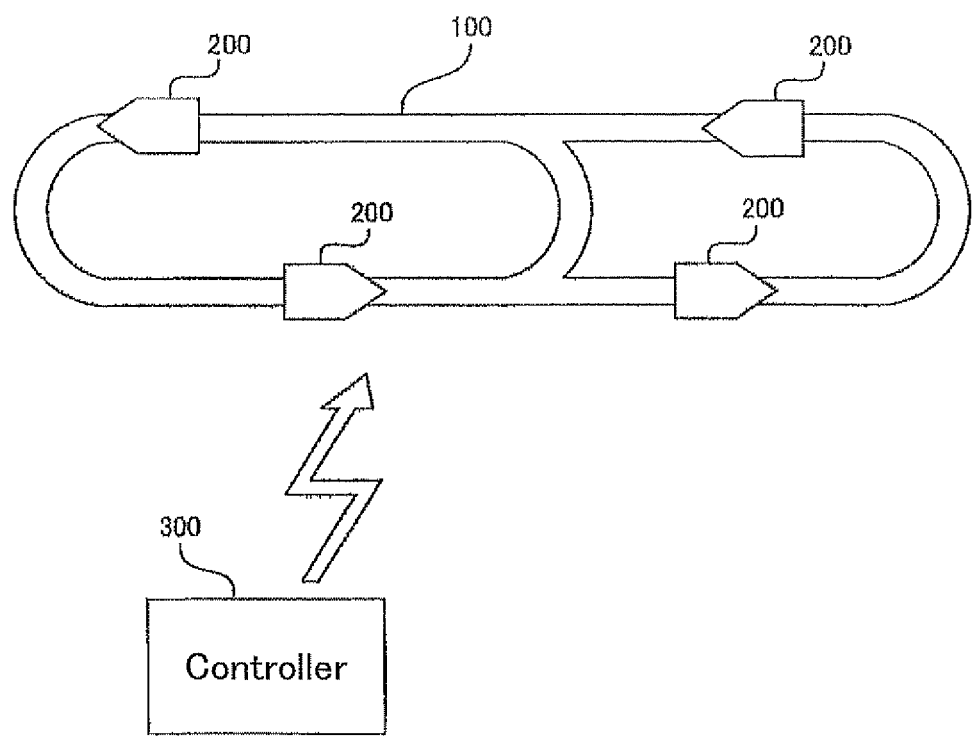
FIG. 1 is a top view showing the entire configuration of the transport system according to the embodiment.

First of all, the overall configuration of the transport system according to the present embodiment will be explained with reference to FIG. 1. FIG. 1 is a top view showing the overall configuration of the transport system according to the embodiment.

In FIG. 1, the transport system according to the embodiment includes a rail 100, transport vehicles 200, and a controller 300.

The rail 100 is provided on a ceiling, for example, and is made of metal such as aluminum and stainless steel.

Along the rail 100, the plurality of the transport vehicles 200 are provided. The transport vehicle 200 travels along the rail 100 so as to transport FOUPs and reticles as transport articles.

The controller 300 includes an arithmetic circuit, memory, and other devices, and is configured to send a transport instruction to the transport vehicles 200. The transport vehicle 200 includes a travelling controller (not shown). The travelling controller controls the transport vehicle 200 to move to a predetermined position based on the transport instruction from the controller 300.

Although not shown in the figures, a plurality of buffers are provided at predetermined positions along the rail 100 for temporarily storing the FOUPs. The structure of the buffer will be later described in detail.

Figure 2:
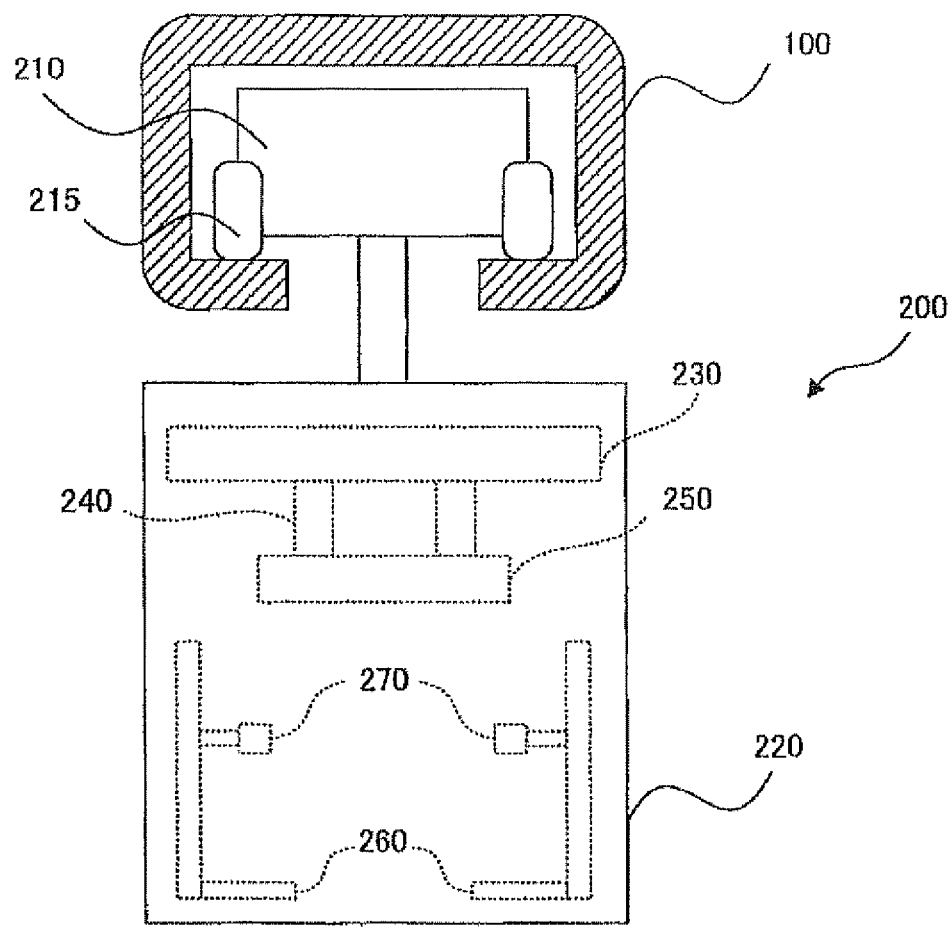
FIG. 2 is a lateral view showing the configuration of the transport vehicle according to the embodiment.

Next, with reference to FIG. 2, the configuration of the transport vehicle 200 travelling along the rail 100 will be explained. FIG. 2 is a lateral view showing the configuration of the transport vehicle according to the embodiment.

In FIG. 2, the transport vehicle 200 includes a travelling unit 210, a main unit 220, a moving unit 230, lifting belts 240, a holding unit 250, a fall prevention member 260, and a shaking reduction member 270.

The travelling unit 210 is a unit for generating a propelling force. The travelling unit 210 generates, with a linear motor for example, the propelling force. When the travelling unit 210 generates the propelling force, travelling rollers 215 roll. Accordingly, the transport vehicle 200 travels along the rail 100. The travelling unit 210 has a lower surface from which the main unit 220 is hanged. The main unit 220 is one example of "transport unit" according to the present invention.

The moving unit 230 is attached to the main unit 220. Specifically, the moving unit 230 is attached to the main unit 220 such that the moving unit 230 can move laterally relative to the rail 100 (in other words, in right and left direction in FIG. 2). The lifting belts 240 are provided at the lower part of the moving unit 230. In addition, the holding unit 250 is attached to the lifting belts 240 for holding the FOUP. In other words, the holding unit 250 for holding the FOUP is attached to the moving unit 230 via the lifting belts 240. The holding unit 250 can be lifted up and down relative to the main unit 220 by winding or unwinding the lifting belts 240.

The fall prevention member 260 is a member for preventing the FOUP from falling. The fall prevention member 260 supports the loaded FOUP from below. The fall prevention member 260 is provided along the periphery of a lower end of the main unit 220. Specifically, the fall prevention member 260 is provided such that the fall prevention member 260 can project inward from the periphery of the main unit 220.

The shaking reduction member 270 is a member for reducing the shaking of the FOUP. The shaking reduction member 270 reduces the shaking by pushing against side surfaces of the loaded FOUP. The shaking reduction member 270 is provided higher than the fall prevention member 260. The shaking reduction member 270 is provided such that the shaking reduction member 270 can abut with the loaded FOUR The shaking reduction member 270 is supported concentrically with the above-described fall prevention member 260.

The specific configuration and operations of the fall prevention member 260 and the shaking reduction member 270 will be later described in detail.

Figure 3:
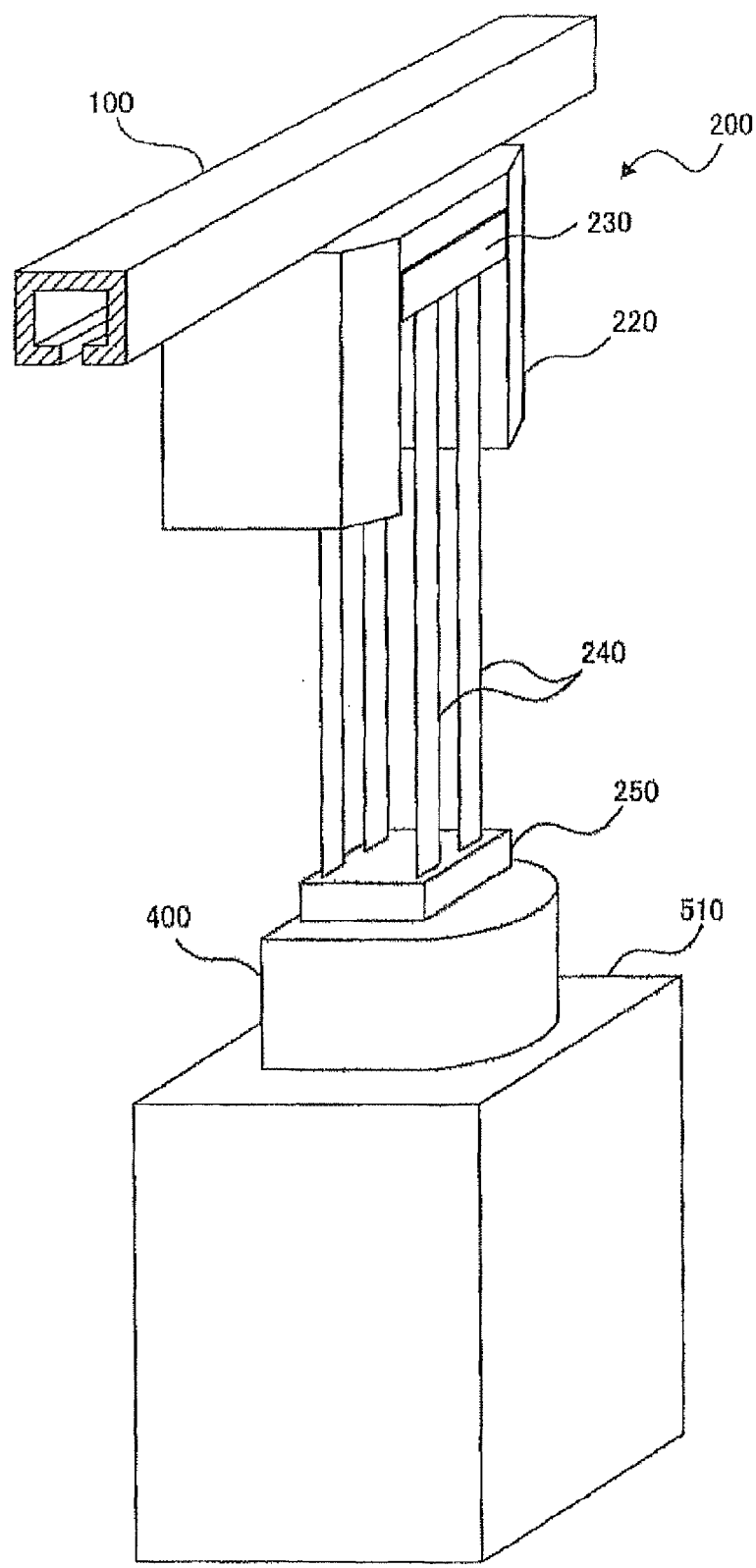
FIG. 3 is a perspective view showing the transfer movement of the transport vehicle according to the embodiment.
Figure 4:
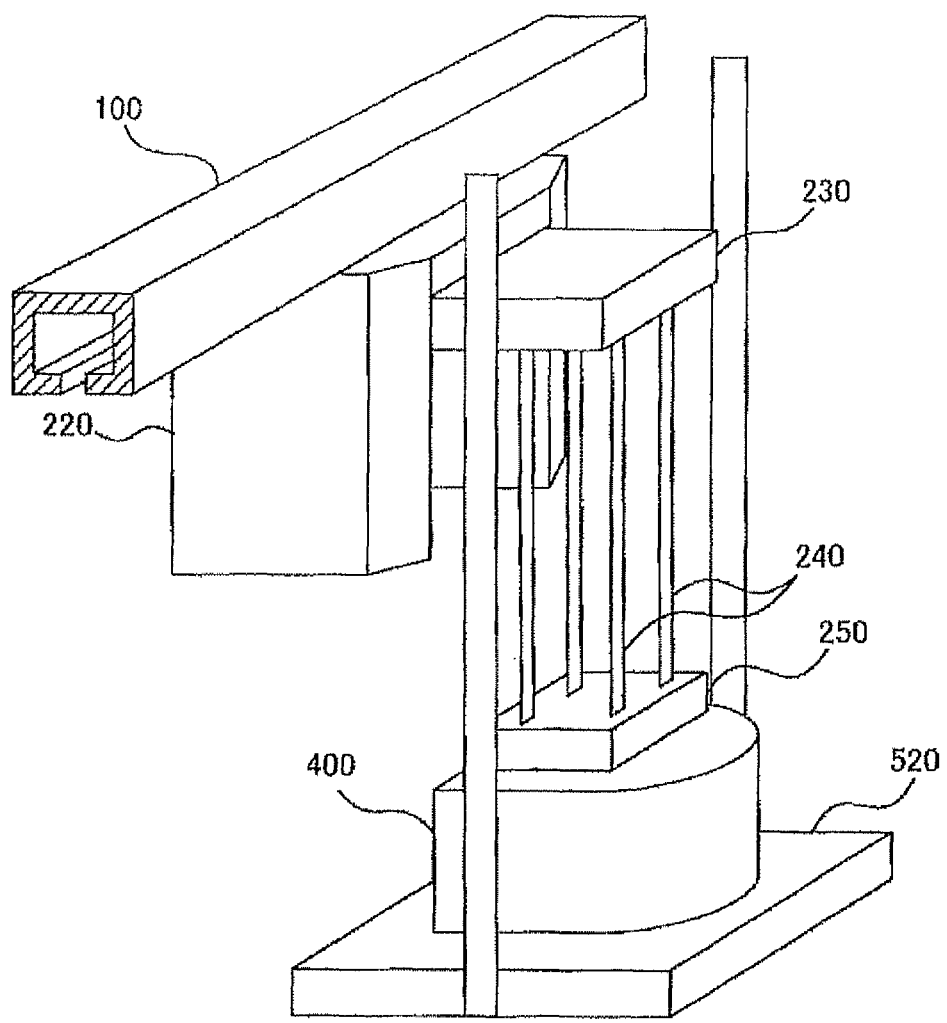
FIG. 4 is a perspective view showing a lateral transfer movement of the transport vehicle according to the embodiment.

Next, the transfer method of the FOUP by the transport vehicle will be explained with reference to FIG. 3 and FIG. 4. FIG. 3 is a perspective view showing transfer movement of the transport vehicle according to the embodiment. FIG. 4 is a perspective view showing lateral transfer movement of the transport vehicle according to the embodiment.

According to FIG. 3, a temporarily storing table 510 (in other words, an under-buffer) is provided directly below the rail 100. When the transport vehicle 200 is to transfer a FOUP 400 placed on the temporarily storing table 510, the transport vehicle 200 first travels along the rail 100, and then stops above the FOUP 400 placed on the temporarily storing table 510.

Next, as shown in FIG. 3, the lifting belts 240 are unwound so that the holding unit 250 is lowered to the position of the FOUP 400. Then, the position of the holding unit 250 relative to the FOUP 400 is fine-tuned, and then the FOUP 400 is held.

Next, the lifting belts 240 are wound up, so that the holding unit 250 and the held FOUP 400 are lifted up to the position of the main unit 220. Then, the transport vehicle 200 resumes traveling along the rail 100, and thereby transports the FOUP 400.

According to FIG. 4, a temporarily storing table 520 (in other words, a side-buffer) is provided at a position that is laterally away from a position directly below the rail 100. In this case, after the moving unit 230 moves in a lateral direction relative to the rail 100, the lifting belts 240 are unwound, so that the holding unit 250 moves down to the position of the FOUP 400. This movement makes it possible to transfer the FOUP 400 in a lateral direction from the rail 100.

Next, the specific configuration of the fall prevention member and the shaking reducing member provided in the transport vehicle according to the present embodiment will be explained in detail with reference to FIG. 5 to FIG. 10.

Figure 5:
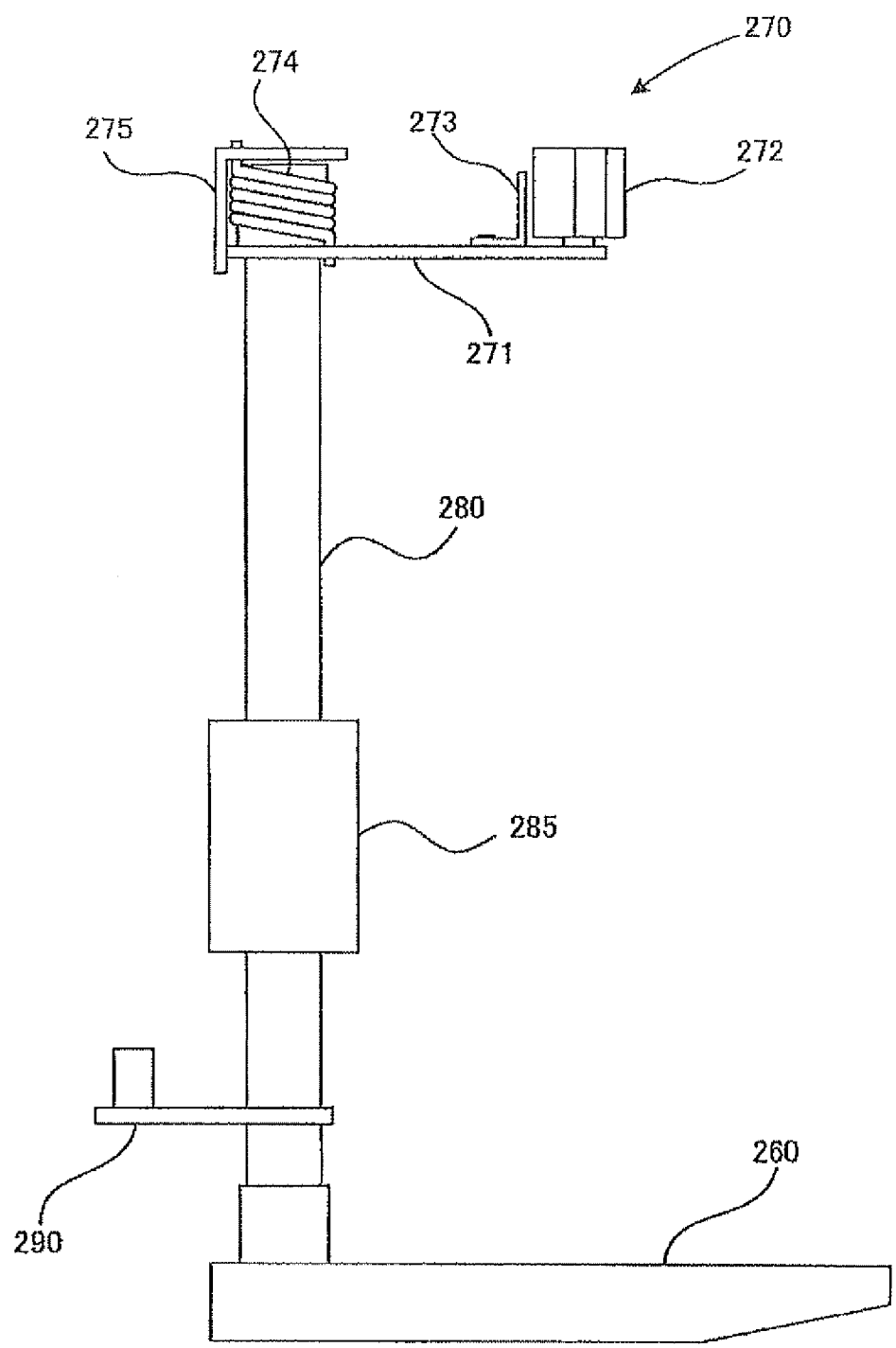
FIG. 5 is a lateral view showing the configuration of the fall prevention member and the shaking reducing member.

FIG. 5 is a lateral view showing the configuration of the fall prevention member and shaking reducing member.

As shown in FIG. 5, the fall prevention member 260 and the shaking reduction member 270 are connected to a shaft 280. The fall prevention member 260 and the shaking reduction member 270 are attached to the shaft 280 with a certain distance between them. In other words, the fall prevention member 260 is attached to one end of the shaft 280, and the shaking reduction member 270 is attached to the other end of the shaft 280. The shaft 280 is rotatably attached to the main unit 220. The fall prevention member 260 and the shaking reduction member 270 rotate around the same axial center (the axial center of the shaft 280) in conjunction with each other. More specifically, with power transmitted from a power transmission part 290, the shaft 280 supported by a bearing holder 285 is rotated, so that the fall prevention member 260 and shaking reduction member 270 attached to the shaft 280 are rotated in a direction extending along a horizontal direction (a direction into the paper or out of the paper in the figures). More specifically, the fall prevention member 260 and the shaking reduction member 270 rotate within a surface perpendicular to the shaft 280 (within a horizontal plane). It should be noted that "a direction extending along a horizontal direction" and "within a surface perpendicular (within a horizontal plane)" are broad concepts that include not only a perfectly horizontal direction and horizontal plane respectively, but also a direction and surface obliquely crossing the horizontal direction and the horizontal plane.

Figure 6:
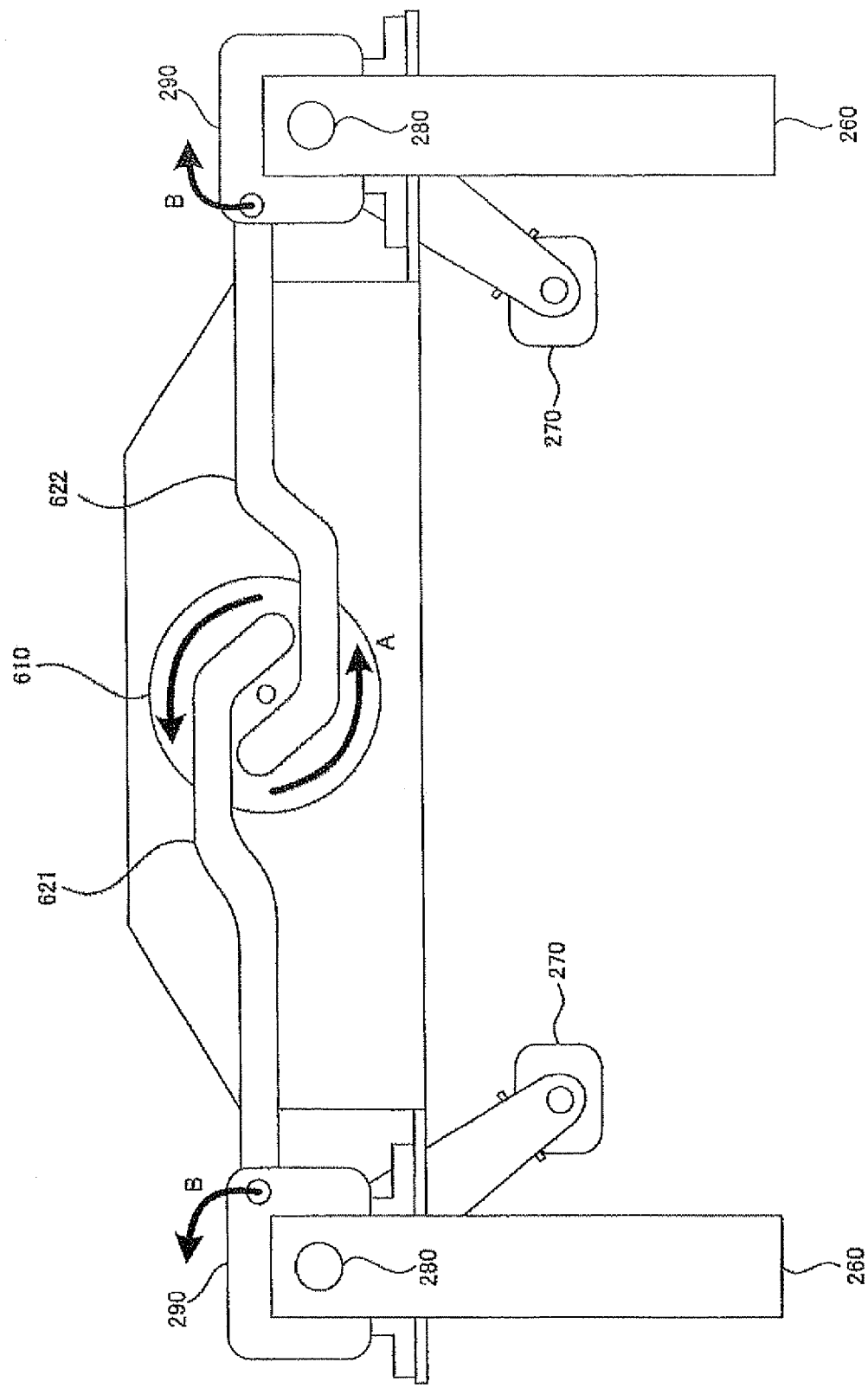
FIG. 6 is a bottom view showing the positioning of the fall prevention member and the shaking reducing member at the fall prevention position.
Figure 7:
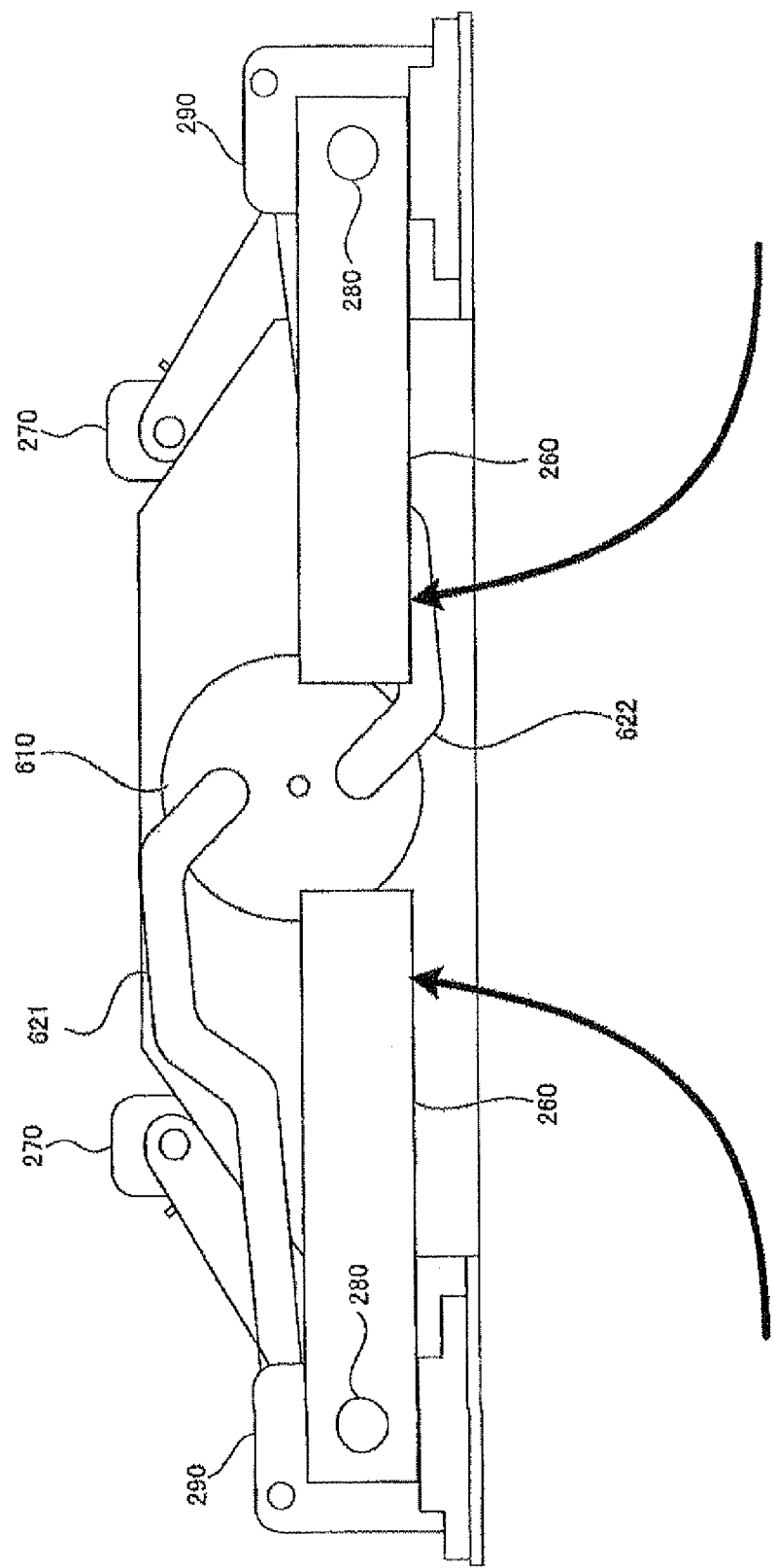
FIG. 7 is a bottom view showing the positioning of the fall prevention member and the shaking reduction member at the retracted position.
Figure 8:
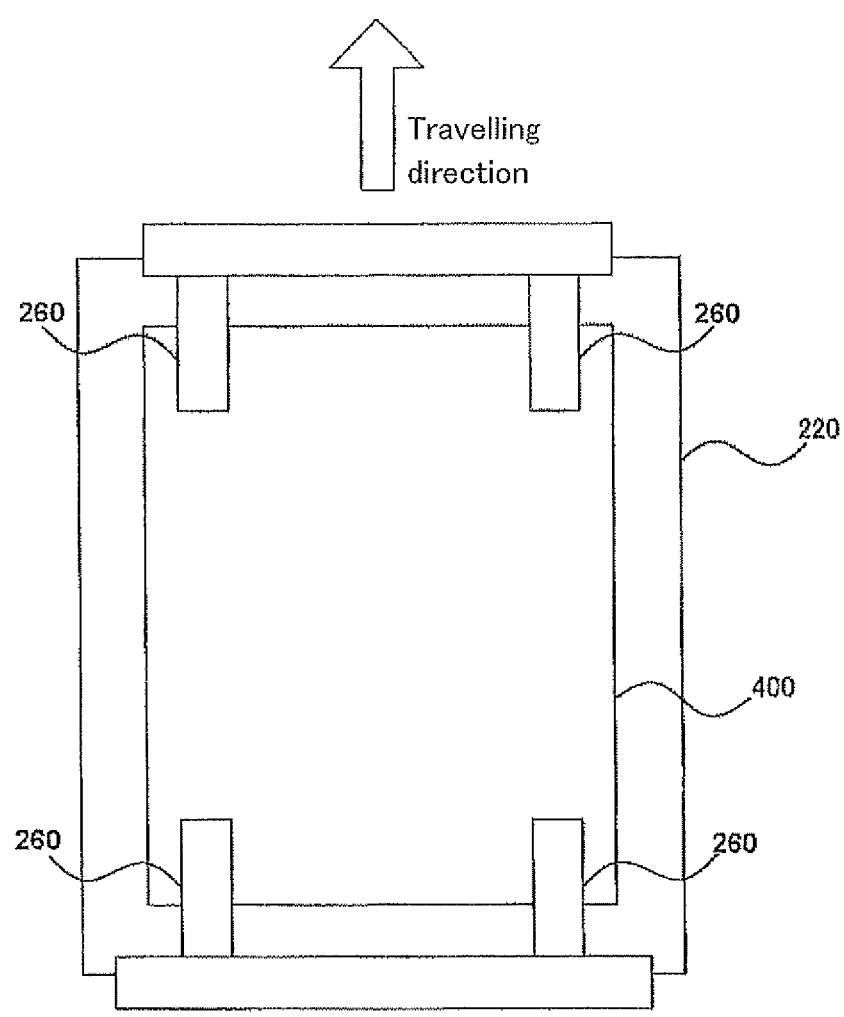
FIG. 8 is a bottom view showing the located position of the fall prevention member of the transport vehicle.

Next, the rotating action of the fall prevention member 260 and the shaking reduction member 270 is explained with reference to FIG. 6 and FIG. 7. FIG. 6 is a bottom view showing the positioning of the fall prevention member and the shaking reducing member at a fall prevention position. FIG. 7 is a bottom view showing the positioning of the fall prevention member and the shaking reducing member at a retracted position. FIG. 8 is a bottom view showing the arranged position of the fall prevention member in the transport vehicle.

As shown in FIG. 6 and FIG. 7, the fall prevention member 260 and the shaking reduction member 270 are connected to a rotation mechanism 610 via cranks 621 and 622, Accordingly, it is possible to control the rotating action of the fall prevention member 260 and the shaking reduction member 270 with the rotation of the rotation mechanism 610. It should be noted that the rotation mechanism 610 is rotated by an actuator (not shown) for example.

As shown in FIG. 6, if the rotation mechanism 610 is rotated in a direction of an arrow A in the figure when the fall prevention member 260 is positioned at a fall prevention position, the cranks 621 and 622 rotate the power transmission part 290 in a direction of an arrow B in the figure. Accordingly, the fall prevention member 260 is moved to a retracted position shown in FIG. 7. In addition, the shaking reduction member 270 moves to the retracted position in conjunction with the movement of the fall prevention member 260.

When the FOUP 400 is to be transferred, the fall prevention member 260 and the shaking reduction member 270 are positioned at the retracted position shown in FIG. 7. In other words, the fall prevention member 260 and the shaking reduction member 270 are accommodated so as to not protrude into a storage space of the FOUP 400. Accordingly, it is possible to prevent the members from colliding with the loaded FOUP 400. After the FOUP 400 is transferred, the fall prevention member 260 and the shaking reduction member 270 are positioned at the fall prevention position shown in FIG. 6. The fall prevention member 260 protrudes toward a space under the loaded FOUP 400 in order to prevent the FOUP from falling. The shaking reduction member 270 reduces the shaking of FOUP 400 by pushing against the side surfaces of the loaded FOUP 400.

As shown in FIG. 8, four fall prevention members 260 are disposed along the periphery of the lower end of the main unit 220 of the transport vehicle 200. Since the fall prevention members 260 are provided in such a manner, even if the loaded FOUP 400 falls off from the holding unit 250, it is possible to support the FOUP 400 by the fall prevention members 260. In other words, the FOUP 400 is surely prevented from falling off from the transport vehicle 200.

It should be noted that the number of the fall prevention members 260 does not have to be four. As long as they can support the FOUP 400, the number may be less than four. Alternatively, in order to improve the load-carrying capacity, the number of the fall prevention members 260 may be more than four.

Figure 9:
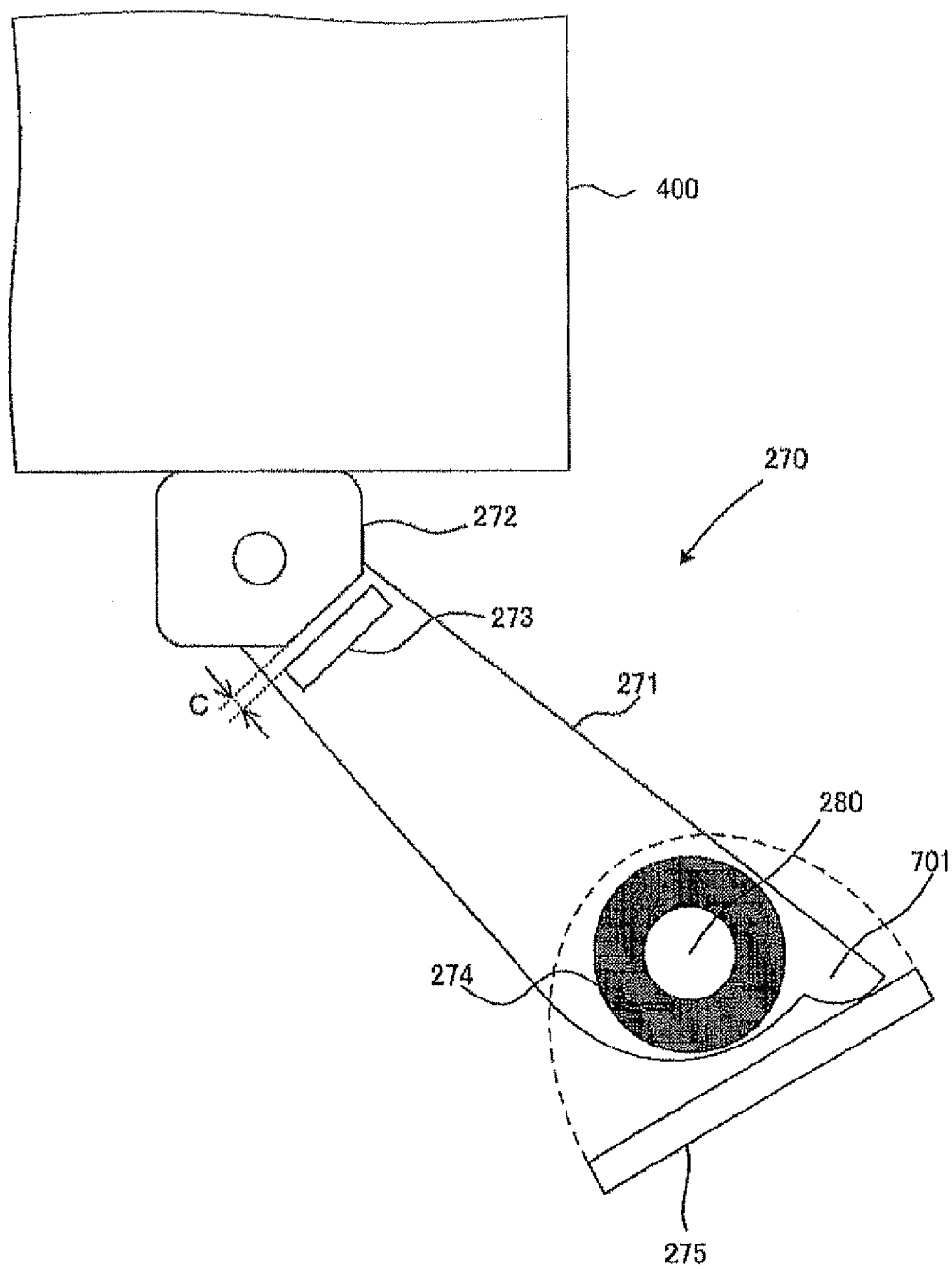
FIG. 9 is a top view showing the concrete configuration of the shaking reducing member.
Figure 10:
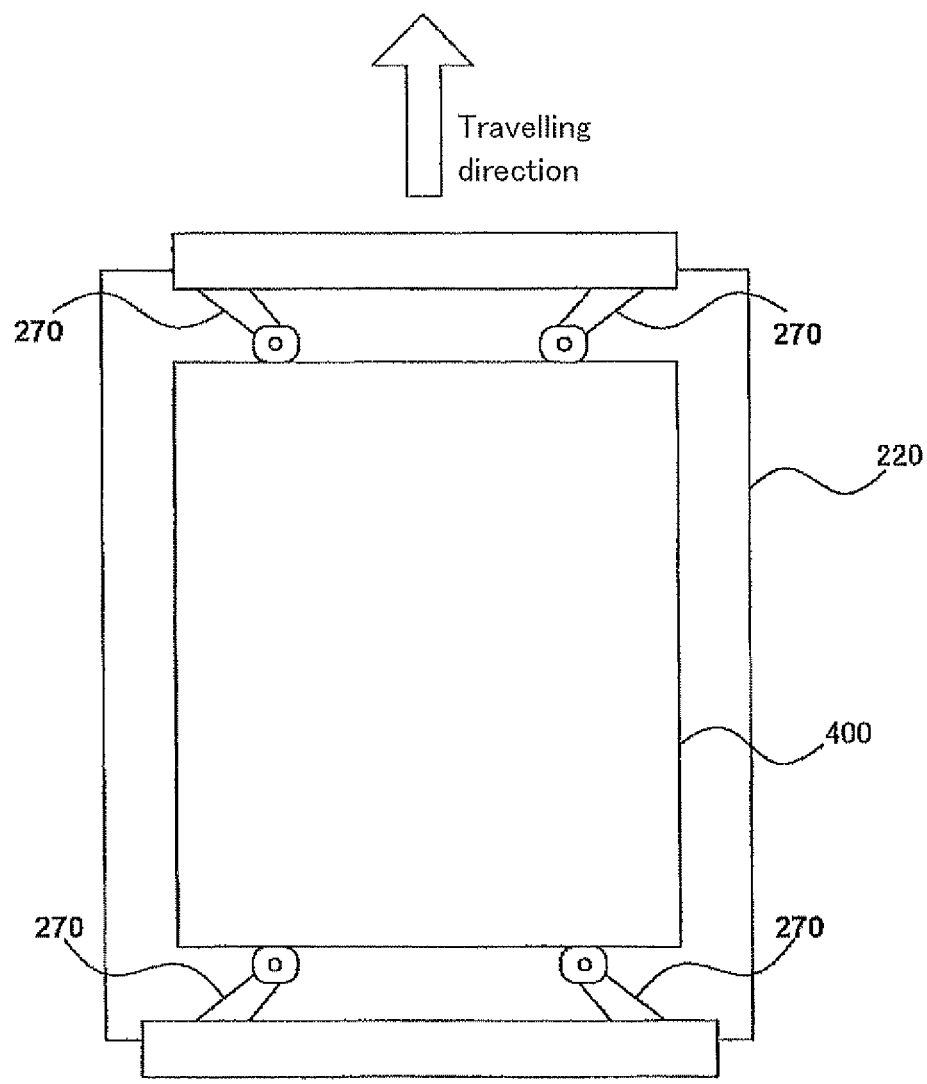
FIG. 10 is a partial sectional view showing a placed position of the shaking reducing member of the transport vehicle, seen from the below.

Next, more specific structure of the shaking reduction member will be explained with reference to FIG. 9 and FIG. 10. FIG. 9 is a top view showing the specific configuration of the shaking reducing member. FIG. 10 is a partial sectional view showing the arranged position of the shaking reducing member in the transport vehicle, as seen from below.

In FIG. 9, the shaking reduction member 270 includes a lever portion 271, a pushing portion 272, a rotating restriction portion 273, a torsion spring 274, and a stopper 275.

One end of the lever portion 271 is attached to the shaft 280. Attached to the other end of the lever portion 271 is the pushing portion 272. If the lever portion 271 is rotated in conjunction with the rotation of the shaft 280, the pushing portion 272 gets into contact with the side surface of the FOUP 400.

The pushing portion 272 may be composed of a material having elasticity, such as resin. The pushing portion 272 is rotatably attached to one end of the lever portion 271. The pushing portion 272 pushes the side surface of the FOUP 400 by a pushing surface in a plane-to-plane manner. Accordingly, it is possible to considerably advantageously reduce the shaking of the FOUP 400.

The rotating restriction portion 273 prevents the pushing portion 272 from rotating freely. The rotating restriction portion 273 is one example of "rotating restriction portion" of the present invention. The rotating restriction portion 273 is provided on the lever portion 271 so as to be opposite to a cutout portion of the pushing portion 272. In other words, the rotating restriction portion 273 is provided on the lever portion 271 such that the pushing portion 272 can rotate within a predetermined range.

Since the rotating restriction portion 273 restricts the rotating of the pushing portion 272, the pushing portion 272 can surely push against the side surface of the FOUP 400 in a plane-to-plane manner. The predetermined amount within which the pushing portion 272 can rotate can be set by adjusting the size of a gap C (clearance) between the pushing portion 272 and the rotating restriction portion 273. Specifically, if the clearance C is increased, the range within which the pushing portion 272 can rotate becomes larger, and if the clearance C is decreased, the range within which the pushing portion 272 can rotate becomes smaller.

The torsion spring 274 is provided around the shaft 280. The torsion spring 274 is one example of "urging member" of the present invention. One end of the torsion spring 274 is attached to the lever portion 271. The other end of the torsion spring 274 is attached to the stopper 275 (refer to FIG. 5). The torsion spring 274 pushes, by means of urging force, the pushing portion 272 against the FOUP 400. Since the torsion spring 274 is used, the pushing portion 272 pushes against FOUP 400 not rigidly, but with flexibility to some degree. Accordingly, it is possible to prevent the vibration of the loaded FOUP 400 from increasing.

The stopper 275 is configured to rotate together with the lever portion 271 in response to the rotation of the shaft 280. The stopper 275 is one example of "projection control member" of the present invention. When the fall prevention member 260 is positioned at the retracted position, the stopper 275 pushes against the shaking reduction member 270 so as to prevent the shaking reduction member 270 from projecting toward the transport article. Specifically, the stopper 275 gets into contact with a convex portion 701 of the lever portion 271 so as to prevent the lever portion 271 from rotating. When the fall prevention member 260 is positioned at the fall prevention position, the stopper 275 releases the pushing against the shaking reduction member 270, so that the shaking reduction member 270 is allowed to project toward the transport article. Specifically, when the pushing portion 272 gets into contact with the FOUP 400, a gap is created between the stopper 275 and the convex portion 701 of the lever portion 271. The size of the gap corresponds to the amount of the pushing portion 272 compressed by the FOUP 400.

As shown in FIG. 10, four shaking reduction members 270 corresponding to the fall prevention members 260 (refer to FIG. 8) of the transport vehicle 200 are provided on the main unit 220. By having the shaking reduction members 270, it is possible to hold the loaded FOUP 400 in a direction along the travelling direction of the transport vehicle 200, thereby reducing the shaking in the pushing direction. Furthermore, since the shaking reduction members 270 pushes against the FOUP 400 in a plane-to-plane manner, it is also possible to reduce the shaking in a direction intersecting the travelling direction of the transport vehicle 200 (in other word, lateral shaking).

Moreover, in the shaking reduction member 270 according to the present embodiment, the lever portion 271 is formed as a member elongated in one direction. In this case, the pushing portion 272 abuts against the side surface of the FOUP 400 in a way that an axial line in the longitudinal direction of the lever portion 271 is inclined relative to the side surface of the FOUP 400. More specifically, the pushing portion 272 abuts against the side surface of the FOUP 400 in a way that the inclination angle defined between the axial line in the longitudinal direction of the lever portion 271 and an axial line in the horizontal direction perpendicular to the travelling direction is acute. Accordingly, even if the pushing surface is not provided with rolling elements like rollers, it is possible to considerably advantageously push against the FOUP 400. Accordingly, it is possible to effectively reduce the shaking of the FOUP 400. It should be noted that the axial line in the longitudinal direction of the lever portion 271 corresponds to a line connecting an axial center of the shaft 280 and a rotating axial center of the pushing portion 272.

Especially, in this embodiment, the fall prevention member 260 and the shaking reduction member 270 are coaxially supported by the shaft 280 (refer to FIG. 5). Accordingly, it is possible to avoid a situation in which the position at which the pushing portion 272 of the shaking reduction member 270 starts to get into contact with the FOUP 400 and the position at which the fall prevention member 260 has completed its projection are different from each other. As a result, the pushing portion 272 of the shaking reduction member 270 can be configured as a member that can push against the FOUP 400 in a plane-to-plane manner, for example, instead of a member like rollers.

As described above, according to a transport system of the present embodiment, since the fall prevention member 260 and the shaking reduction member 270 are coaxially supported on the transport vehicle 200, it is possible to advantageously prevent the FOUP 400 from falling, and to advantageously reduce the shaking of the FOUP 400.

The present invention is not limited to the above-described embodiment. It is possible to change the embodiment within gist or concept of the invention understood based on the claims and the entire specification, and the transport vehicle and transport system changed accordingly would be included in the technical scope of the present invention.

Industrial Applicability

The present invention can be broadly applied to a transport vehicle, and to a transport system having a transport vehicle.

Explanation of Reference 100 rail
200 transport vehicle
210 travelling unit
215 travelling rollers
220 main unit
230 moving unit
240 lifting belt
250 holding unit
260 fall prevention member
270 shaking reduction member
271 lever portion
272 pushing portion
273 rotating restriction portion
274 torsion spring
275 stopper
280 shaft
290 power transmission part

300 controller
400 FOUP
510, 520 temporarily storing table
610 rotation mechanism
621, 622 crank

The invention claimed is:

1. A transport vehicle comprising:
a travelling unit configured to travel along a rail provided on a ceiling;
a transport unit attached to the travelling unit, the transport unit being configured to transport a transport article while having the transport article stored in a storage space thereof;
a fall prevention member provided around a lower end of the transport unit, the fall prevention member being rotatably supported so as to rotate between a retracted position in which the fall prevention member allows the transport article to be accommodated into the storage space and a fall prevention position in which the fall prevention member prevents the transport article from falling from the storage space, the fall prevention member being disposed under the transport article when the fall prevention member is positioned at the fall prevention position; and
a shaking reduction member including a pushing portion and a lever portion, the pushing portion being provided higher than the fall prevention member and pushing against a side surface of the transport article with a pushing surface thereof in conjunction with the rotating of the fall prevention member from the retracted position to the fall prevention position, the lever portion having one end supporting the pushing portion and the other end rotatably supported in a manner coaxial with the fall prevention member.

2. The transport vehicle according to claim 1, wherein the pushing portion gets into contact with the transport article in a way that an axial line of the lever portion in a longitudinal direction is inclined relative to the side surface of the transport article.

3. The transport vehicle according to claim 1, wherein the shaking reduction member includes a projection control member, the projection control member being configured to prevent the shaking reduction member from projecting toward the transport article by pushing against the shaking reduction member when the fall prevention member is positioned at the retracted position and to allow the shaking reduction member to project toward the transport article by releasing the pushing against the shaking reduction member when the fall prevention member is positioned at the fall prevention position.

4. The transport vehicle according to claim 1, wherein the shaking reduction member includes an urging member urging the one end of the lever portion toward the side surface of the transport article.

5. The transport vehicle according to claim 1, wherein the pushing portion is rotatably supported by the lever portion.

6. The transport vehicle according to claim 5, wherein the lever portion includes a rotating restriction member configured to restrict the rotating of the pushing portion at or below a predetermined amount.

7. A transport system comprising the transport vehicle according to claim 1.

* * * * *